(12) United States Patent
Modarres et al.

(10) Patent No.: US 8,878,806 B2
(45) Date of Patent: Nov. 4, 2014

(54) HAPTIC FEEDBACK USING COMPOSITE PIEZOELECTRIC ACTUATOR

(71) Applicant: Immersion Corporation, San Jose, CA (US)

(72) Inventors: Ali Modarres, Mont-Royal (CA); Juan Manuel Cruz-Hernandez, Montreal (CA); Danny A. Grant, Laval (CA); Christophe Ramstein, San Francisco, CA (US)

(73) Assignee: Immersion Corporation, San Jose, CA (US)

( * ) Notice: Subject to any disclaimer, the term of this patent is extended or adjusted under 35 U.S.C. 154(b) by 68 days.

(21) Appl. No.: 13/775,689

(22) Filed: Feb. 25, 2013

(65) Prior Publication Data

US 2013/0162579 A1 Jun. 27, 2013

Related U.S. Application Data

(63) Continuation of application No. 12/542,795, filed on Aug. 18, 2009, now Pat. No. 8,390,594.

(51) Int. Cl.
*G06F 3/041* (2006.01)

(52) U.S. Cl.
USPC .......................................... 345/173; 345/175

(58) Field of Classification Search
CPC ......... G06F 3/016; G06F 3/041; G06F 3/044; G06F 3/045; G06F 3/0414
USPC ............ 345/169, 173–179; 178/18.01–18.09, 178/19.01–19.06, 20.01–20.04
See application file for complete search history.

(56) References Cited

U.S. PATENT DOCUMENTS

| | | |
|---|---|---|
| 4,572,981 A | 2/1986 | Zola |
| 4,755,707 A | 7/1988 | Nakaya et al. |
| 4,801,835 A | 1/1989 | Nakaya et al. |

(Continued)

FOREIGN PATENT DOCUMENTS

| | | |
|---|---|---|
| CN | 1678978 | 10/2005 |
| CN | 1688961 | 10/2005 |

(Continued)

OTHER PUBLICATIONS

Office Action issued for Chinese Patent Application No. 201080036775.4, dated Mar. 27, 2014.

(Continued)

*Primary Examiner* — Vijay Shankar
(74) *Attorney, Agent, or Firm* — Pillsbury Winthrop Shaw Pittman LLP

(57) ABSTRACT

An input/output device includes a touch sensitive layer configured to sense if an object touches the touch sensitive layer and to sense where the touch sensitive layer is contacted, a first electrode layer and second electrode layer, at least a portion of one of the first electrode layer and second electrode layer connected to at least a portion of the touch sensitive layer, and a composite piezoelectric layer connected between the first electrode layer and second electrode layer. The composite piezoelectric layer has a plurality of piezoelectric rods arranged in a polymer matrix. The polymer matrix provides the composite piezoelectric layer with a predetermined property. A drive circuit is configured to apply an alternating voltage to the first electrode layer and second electrode layer in response to the sensed object.

14 Claims, 2 Drawing Sheets

(56) References Cited

U.S. PATENT DOCUMENTS

| | | |
|---|---|---|
| 5,065,068 A | 11/1991 | Oakley |
| 6,128,671 A * | 10/2000 | Weijand ............................ 710/5 |
| 6,822,635 B2 * | 11/2004 | Shahoian et al. ............. 345/156 |
| 7,663,604 B2 | 2/2010 | Maruyama et al. |
| 7,701,445 B2 | 4/2010 | Inokawa et al. |
| 7,755,607 B2 | 7/2010 | Poupyrev et al. |
| 7,952,566 B2 | 5/2011 | Poupyrev et al. |
| 8,098,234 B2 | 1/2012 | Lacroix et al. |
| 2003/0051561 A1 | 3/2003 | Weiss |
| 2003/0071795 A1 * | 4/2003 | Baldauf et al. ................ 345/173 |
| 2005/0057528 A1 | 3/2005 | Kleen |
| 2006/0028095 A1 | 2/2006 | Maruyama et al. |
| 2006/0049920 A1 | 3/2006 | Sadler et al. |
| 2008/0198139 A1 | 8/2008 | Lacroix et al. |
| 2009/0002328 A1 | 1/2009 | Ullrich et al. |
| 2009/0128305 A1 | 5/2009 | Mortimer et al. |
| 2009/0167704 A1 | 7/2009 | Terlizzi et al. |
| 2009/0181724 A1 | 7/2009 | Pettersson |

FOREIGN PATENT DOCUMENTS

| | | |
|---|---|---|
| JP | 62-275764 | 11/1987 |
| JP | 1-273373 | 11/1989 |
| JP | 5-219595 | 8/1993 |
| JP | 2005-078644 | 3/2005 |
| KR | 10-0759704 | 9/2007 |
| WO | WO 97/06649 | 2/1997 |
| WO | WO 2009/011605 | 1/2009 |

OTHER PUBLICATIONS

Office Action issued for Japanese Patent Application No. 2012-525625, dated Apr. 1, 2014.

International Search Report and Written Opinion as issued for PCT/US2010/045584, dated Jan. 17, 2011.

* cited by examiner

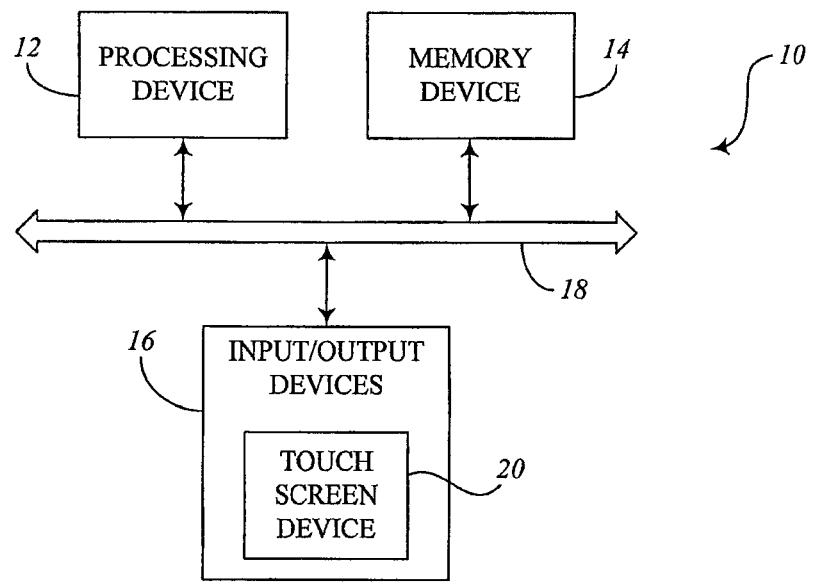
*FIG. 1*
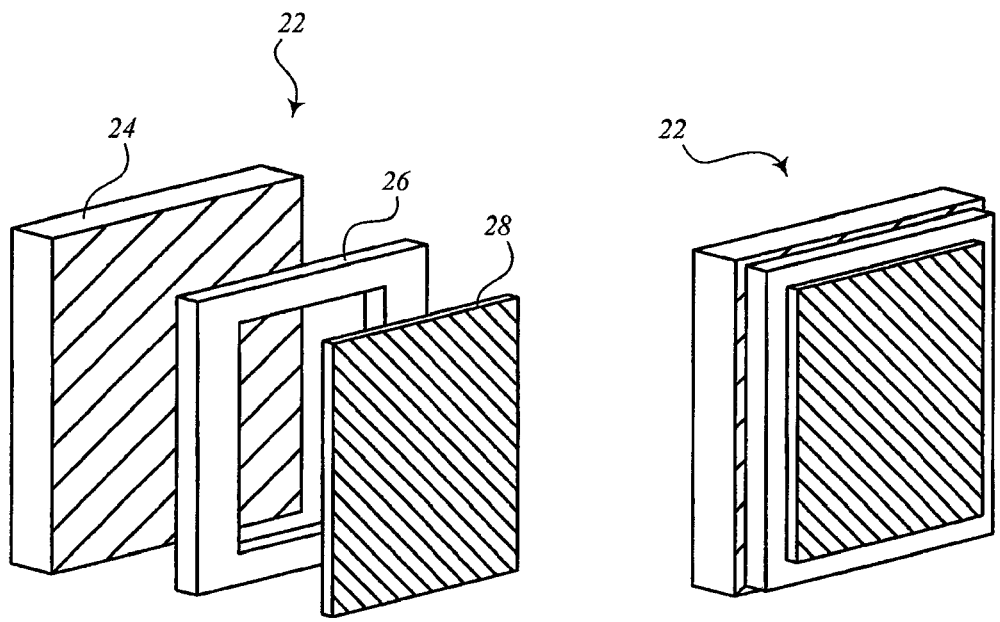
*FIG. 2A*  *FIG. 2B*

HAPTIC FEEDBACK USING COMPOSITE PIEZOELECTRIC ACTUATOR

CROSS-REFERENCE TO RELATED APPLICATIONS

This application is a continuation application of U.S. patent application Ser. No. 12/542,795, filed Aug. 18, 2009 and incorporated herein by reference in its entirety.

FIELD

The embodiments of the present disclosure generally relate to providing haptic feedback in a human-computer interface and more particularly relate to haptic feedback structures using composite piezoelectric actuators.

BACKGROUND

Electronic device manufacturers strive to produce a rich interface for users. Conventional electronic devices often provide visual and/or auditory feedback to communicate information to users. In some cases, kinesthetic feedback (such as active and resistive force feedback) and/or tactile feedback (such as vibration, texture, and heat) may also be provided to the user to enhance the user experience. Generally speaking, kinesthetic feedback and tactile feedback are collectively known as "haptic feedback" or "haptic effects." Haptic feedback may be useful for providing cues to alert the user of specific events or to provide realistic feedback sensations to create a greater sensory experience. Haptic feedback can be used with common electronic devices and even devices used for creating a simulated or virtual environment.

In order to generate haptic effects, some type of haptic actuator can be utilized. Examples of known haptic actuators include electromagnetic actuators, such as an Eccentric Rotating Mass ("ERM") in which an eccentric mass is moved by a motor, a Linear Resonant Actuator ("LRA") in which a mass attached to a spring is driven back and forth, a "smart material" such as piezoelectric material, electro-active polymers, or shape memory alloys, etc. Many of these actuators and the devices with which they interact typically have resonant frequencies, which can be built in or dynamically determined. Drive signals can be applied to the actuators to generate the haptic effects effectively and efficiently.

SUMMARY

The present disclosure describes embodiments of systems, electronic devices, and input/output devices for providing haptic feedback to a user. In some embodiments, a human-computer interface includes a display device and a touch sensitive device. The display device is configured to visually display images to a user and the touch sensitive device is configured to sense contact with the user. Furthermore, the human-computer interface includes a composite piezoelectric layer positioned between the display device and the touch sensitive device. The composite piezoelectric layer is configured to provide haptic feedback to the user.

The embodiments described in the present disclosure may include various features and advantages, which may not necessarily be expressly disclosed herein but will be apparent to one of ordinary skill in the art upon examination of the following detailed description and accompanying drawings. It is intended that these features and advantages be included within the present disclosure.

BRIEF DESCRIPTION OF THE DRAWINGS

The components of the following figures are illustrated to emphasize the general principles of the present disclosure and are not necessarily drawn to scale. Reference characters designating corresponding components are repeated as necessary throughout the figures for the sake of consistency and clarity.

FIG. 1 is a block diagram showing a general schematic of an electronic device, according to various embodiments of the invention.

FIG. 2A is a diagram illustrating an exploded view of a human-computer interface, according to various embodiments of the invention.

FIG. 2B is a diagram illustrating an assembled view of the human-computer interface of FIG. 2A, according to various embodiments of the invention.

DETAILED DESCRIPTION

Figure 3:
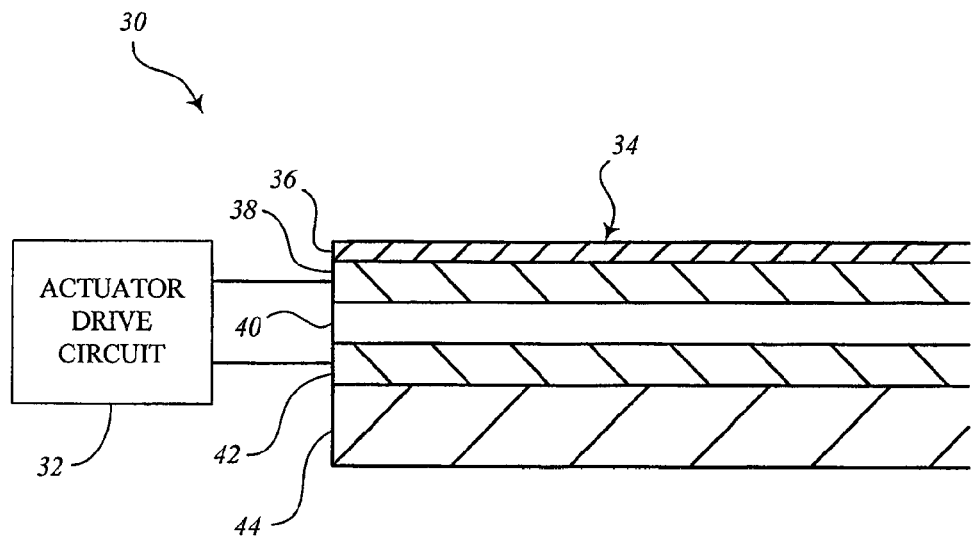
FIG. 3 is a diagram illustrating an embodiment of a touch surface device and illustrating a side view of a laminated structure of the touch surface device, according to various embodiments of the invention.

The present disclosure describes embodiments of haptic feedback actuators that impose haptic effects on a user via a user interface, human-computer interface, or other portions of a user device on which or within which the actuators reside. In particular, the embodiments of the haptic feedback actuators described herein can be configured to apply haptic effects to a touch sensitive surface of a user device. The touch sensitive surface, in some embodiments, can be part of a display device that may include both a visual output mechanism and a touch sensitive input mechanism. Thus, haptic feedback can be applied in user devices, such as electronic handheld devices, for providing a rich sensory experience for the user.

Various haptic actuation technologies have been used in the past to provide vibrotactile haptic feedback to touch sensitive devices, such as touch screens. Known haptic feedback devices use electric actuators, such as Linear Resonant Actuator ("LRA") devices and Eccentric Rotating Mass ("ERM") devices. However, these actuators are generally not scalable and do not always performance sufficiently in haptic applications. These devices are often very bulky and can have difficulty meeting certain space limitations. Furthermore, these types of devices usually consume a large amount of power.

Another conventional haptic feedback technology in touch sensitive devices is electro-active polymer ("EAP") devices. One drawback of this technology, however, is that EAP-based actuators normally require thousands of volts of electricity to provide effects that are suitable for haptic applications.

Development of haptic feedback structures has led to smaller, more compact devices. Hence, another line of technologies for providing haptic feedback in touch sensitive devices is monolithic piezoelectric ceramics. Actuators made from these ceramics, referred to as monolithic piezoelectric actuators, offer satisfactory solutions for haptic feedback because of their scalability and fast dynamics. However, the mechanical integration and mounting of such actuators into consumer products can often be troublesome. Also, monolithic piezoelectric ceramics are normally quite fragile and brittle and can break if the electronic device incorporating the ceramics is dropped or if it experiences other similar forces or stresses. It can be difficult at times to integrate monolithic piezoelectric ceramics into commercialized products.

In contrast with the use of monolithic piezoelectric actuators, the present disclosure describes use of "composite piezoelectric actuators" to provide haptic feedback. Composite piezoelectric material may be used to achieve specific characteristics of a haptic feedback device. For instance, mechanical strength, stiffness, damping coefficients, toughness, flexibility, displacement to length ratio, power consumption, actuation force, etc., can be optimized to meet particular electromechanical targets for specific applications. In addition, because of the flexibility characteristics of composite piezoelectric material, the haptic feedback actuators can serve as a viscoelastic suspension for a touch screen, which can be placed on a haptic feedback actuator. By tuning the viscoelastic characteristics, the resonant frequency of the touch screen structure can be adjusted.

In some embodiments, the composite piezoelectric actuators can be formed as "haptic tape," which may have a form factor similar to regular tape. In contrast to regular tape, however, haptic tape can be stimulated in any suitable manner to provide haptic feedback to a user touching the tape. Furthermore, when the composite piezoelectric actuators are created in haptic tape form, the tape can also serve as a sealant between two components. For example, in the case of using haptic tape with a touch screen, the haptic tape acts as a sealant between a touch surface layer and an underlying display device, such as a liquid crystal display ("LCD").

Although many of the examples described herein relate to touch screen devices, it should be understood that the present disclosure also encompasses other types of human-computer interfaces involving touch sensitive structures. In addition, other features and advantages will be apparent to one of ordinary skill in the art upon reading and understanding the general principles of the present disclosure. These other features and advantages are intended to be included in the present disclosure as well.

FIG. 1 is a block diagram of an electronic device 10 in accordance with one embodiment. More particularly, electronic device 10 includes a processing device 12, a memory device 14, and input/output devices 16, which are interconnected via a bus 18. Furthermore, input/output devices 16 includes a touch screen device 20 or other human-computer interface devices.

Touch screen device 20 may be configured as any suitable human-computer interface or touch/contact surface assembly. Touch screen device 20 may be any touch screen, touch pad, touch sensitive structure, computer monitor, laptop display device, workbook display device, kiosk screen, portable electronic device screen, or other suitable touch sensitive device. Touch screen device 20 may be configured for physical interaction with a user-controlled device, such as a stylus, finger, etc. In some embodiments, touch screen device 20 may include at least one output device and at least one input device. For example, touch screen device 20 might include a visual display and a touch sensitive screen superimposed thereon to receive inputs from a user's finger.

In various embodiments, touch screen device 20 provides haptic feedback to at least a portion of electronic device 10, which can be conveyed to a user in contact with electronic device 10. Particularly, touch screen device 20 can provide haptic feedback to the touch screen itself to impose a haptic effect when the user in is contact with the screen. The haptic effects can be used to enhance the user experience, and particularly can provide a confirmation to the user that the user has made sufficient contact with the screen to be detected by touch screen device 20.

Electronic device 10 may be any device, such as a desk top computer, laptop computer, electronic workbook, electronic handheld device (such as a mobile phone, gaming device, personal digital assistant ("PDA"), portable e-mail device, portable Internet access device, calculator, etc.), kiosk (such as an automated teller machine, ticking purchasing machine, etc.), printer, point-of-sale device, game controller, or other electronic device.

Processing device 12 may be a general-purpose or specific-purpose processor or microcontroller for managing or controlling the operations and functions of electronic device 10. For example, processing device 12 may be specifically designed as an application-specific integrated circuit ("ASIC") to control output signals to a driver of input/output devices 16 to provide haptic effects. Processing device 12 may be configured to decide, based on predefined factors, what haptic effects are to be played, the order in which the haptic effects are played, and the magnitude, frequency, duration, and/or other parameters of the haptic effects. Processing device 12 can also be configured to provide streaming motor commands that can be used to drive the haptic actuators for providing a particular haptic effect. In some embodiments, processing device 12 may actually include a plurality of processors, each configured to perform certain functions within electronic device 10.

Memory device 14 may include one or more internally fixed storage units, removable storage units, and/or remotely accessible storage units. The various storage units may include any combination of volatile memory and non-volatile memory. The storage units may be configured to store any combination of information, data, instructions, software code, etc. More particularly, the storage devices may include haptic effect profiles, instructions for how the haptic actuation devices of input/output devices 16 are to be driven, or other information for generating haptic effects.

In addition to touch screen device 20, input/output devices 16 may also include specific input mechanisms and output mechanisms. For example, the input mechanisms may include such devices as keyboards, keypads, cursor control devices (e.g., computer mice), or other data entry devices. Output mechanisms may include a computer monitor, virtual reality display device, audio output device, printer, or other peripheral devices. Input/output devices 16 may include mechanisms that are designed to not only receive input from a user and but also provide feedback to the user, such as many examples of touch screen devices. Touch screen device 20 and other input/out devices 16 may include any suitable combination and configuration of buttons, keypads, cursor control devices, touch screen components, stylus-receptive components, or other data entry components. Touch screen device 20 may also include any suitable combination of computer monitors, display screens, touch screen displays, haptic or tactile actuators, haptic effect devices, or other notification devices for providing output to the user.

FIG. 2A is a diagram illustrating an exploded view of an embodiment of a human-computer interface 22. FIG. 2B is a diagram illustrating an assembled view of the embodiment of human-computer interface 22 of FIG. 2A. Human-computer interface 22 in this embodiment includes a display 24, a composite piezoelectric assembly 26, and a touch sensitive device 28. In some embodiments, display 24 is an LCD. In addition to the functionality of sensing touch, touch sensitive device 28 may also include a protective layer for protecting the other layers from environmental effects. Although the components of human-computer interface 22 are shown as planar layers, it should be noted that composite piezoelectric assembly 26 and touch sensitive device 28 can be configured as flexible layers and are capable of conforming to any shape of display 24.

In some embodiments, composite piezoelectric assembly 26 can have a form factor similar to adhesive tape. Also, composite piezoelectric assembly 26 may have an adhesive material applied to one or both sides of the tape, allowing composite piezoelectric assembly 26 to adhere to the surfaces of adjacent objects, such as display 24 and touch sensitive device 28 in this example. The adhesive material may allow composite piezoelectric assembly 26 to be bonded to the surface of another object without the need for screws or other securing mechanisms. More particularly, when configured as adhesive tape, composite piezoelectric assembly 26 is a haptic tape that is capable of providing haptic feedback to a user. Therefore, although composite piezoelectric assembly 26 can be very thin, it is still able to provide haptic effects that can be sensed by a user.

Composite piezoelectric assembly 26 may include at least two electrode layers placed on opposite sides of a composite piezoelectric layer. Composite piezoelectric layers are manufactured and supplied, for example, by Smart Material Corporation based in Sarasota, Fla. When a voltage is applied to the opposing electrode layers to stimulate the composite piezoelectric layer, the composite piezoelectric layer responds by deforming its shape in a direction perpendicular to the plane of the layer. More particularly, the composite piezoelectric layer expands and contracts, whereby the layer primarily changes with respect to its thickness and its length and width remain substantially the same. As a result, when display 24 is maintained in a substantially fixed position, composite piezoelectric assembly 26 can be stimulated to move touch sensitive device 28 in an in-and-out motion.

Furthermore, composite piezoelectric assembly 26 can be formed as is shown in FIG. 2A, like a frame around the outside of display 24. Particularly, composite piezoelectric assembly 26 can be formed from four narrows lengths of material to create a rectangle or can include a rectangular planar portion having a rectangular cut-out in its center. In this configuration, composite piezoelectric assembly 26 forms a seal with touch sensitive device 28 to protect display 24 from the environment. Composite piezoelectric assembly 26 can be formed to completely surround the perimeter of display device 24. In other embodiments, however, it can be configured to only partially surround the perimeter.

In some embodiments, composite piezoelectric assembly 26 may be placed on the other side of display 24 away from touch sensitive device 28 to provide haptic feedback to the entire display device. Composite piezoelectric assembly 26 can be uniform throughout its structure without a cutout in the middle thereof. This structure may help to provide an equal distribution of haptic effects to all portions of display 24. Also, with composite piezoelectric assembly 26 behind display 24, composite piezoelectric assembly does not block any portion of the user's view of display 24. Furthermore, composite piezoelectric assembly 26 may not need to act as a sealant as described above since touch sensitive device 28 can be used to protect display 24. Therefore, composite piezoelectric assembly 26 can be formed with any desired form factor with no particular concern for the functionality of providing sealing properties.

FIG. 3 is a diagram illustrating an embodiment of a touch surface device 30. In some embodiments, the structure of touch surface device 30 may include similar components and functionality as the human-computer interface 22 described with respect to FIGS. 2A and 2B. As illustrated in FIG. 3, touch surface device 30 includes an actuator drive circuit 32 shown in block form and an embodiment of a laminated structure 34 shown from a cross-sectional side view. Laminated structure 34 in this embodiment includes a touch sensitive layer 36, a first electrode layer 38, a composite piezoelectric layer 40, a second electrode layer 42, and a display layer 44 (e.g., an LCD layer). In some embodiments, layers 38, 40, and 42 can make up a composite piezoelectric assembly, such as composite piezoelectric assembly 26 shown in FIG. 2. In some embodiments, laminated structure 34 may include an additional protective layer positioned on top of touch sensitive layer 36 to protect the underlying layers from the environment and from the user's touch. The thickness of each layer is not necessarily drawn to scale and does not necessarily represent the relative dimensions of the layer with respect to the other layers. Other layers and/or other layer configurations may also be used.

Electrode layers 38 and 42 can be designed to have substantially the same flexibility as composite piezoelectric layer 40 and/or touch sensitive layer 36 in order to allow layered structure 34 to properly conform to the shape of the surface of display layer 44. Electrode layers 38 and 42 may be formed on opposite sides of composite piezoelectric layer 40 and may be connected to actuator drive circuit 32, which may be controlled by processing device 12 (FIG. 1) or another processor. Actuator drive circuit 32 is configured to stimulate composite piezoelectric layer 40 to cause it to expand or contract, thereby generating a haptic effect that can be sensed by the user. The electrode layers 38 and 42 are electrically conductive layers for allowing the signals from actuator drive circuit 32 to be distributed across composite piezoelectric layer 40. In some embodiments, electrode layers 38 and 42 equally distribute the signals across composite piezoelectric layer 40. Also, layered structure 34 may be designed such that electrode layers 38 and 42 are electrically in communication with piezoelectric rods or other piezoelectric structure running widthwise through composite piezoelectric layer 40.

Figure 4:
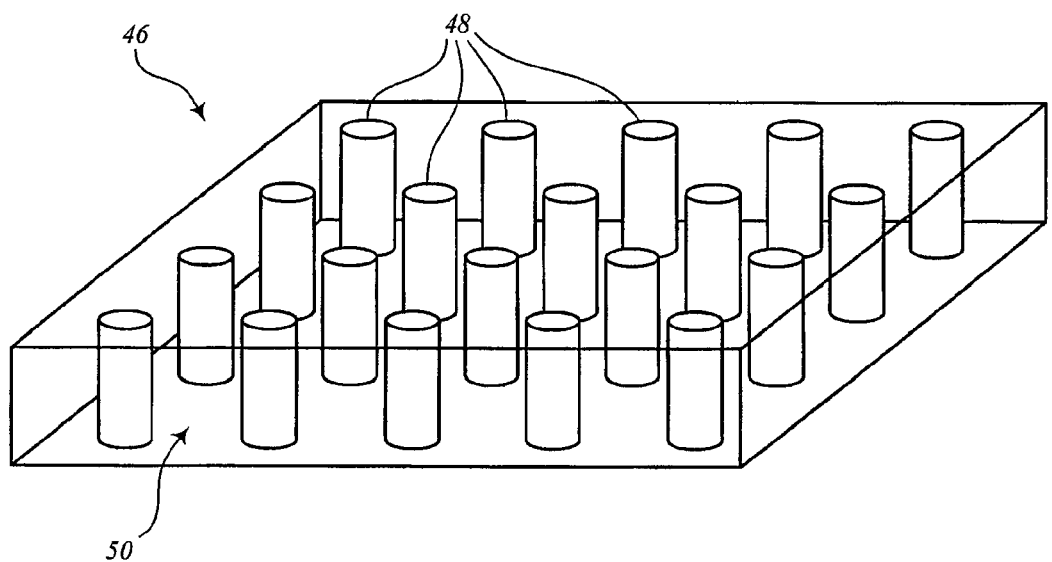
FIG. 4 is a diagram illustrating a perspective view of a section of a composite piezoelectric structure, according to various embodiments of the invention.

FIG. 4 is a diagram illustrating a section of an embodiment of a composite piezoelectric structure 46. In this embodiment, composite piezoelectric structure 46 includes an array of piezoelectric rods 48 embedded in a polymer matrix 50. With this arrangement, the stimulation of piezoelectric rods 48 causes the rods to expand or contract longitudinally.

Generally, composite piezoelectric material contains piezoelectric ceramic fibers, such as piezoelectric rods 48, embedded in a certain pattern within a matrix of polymer. With such an arrangement, it can be possible to achieve desired mechanical and electrical characteristics for specific haptic effects. One realization of this arrangement is a "1-3 composite piezo" arrangement, which is the arrangement shown in FIG. 4. Specifically, the piezoelectric fibers or rods are arranged in one-dimension along a y-axis within a three-dimensional xyz polymer matrix. Properties that normally cannot be achieved by each of the components alone can be achieved by attaching these materials at a micro level or macro level within the context of various connectivity patterns.

Various arrangements of piezoelectric rods 48 and polymer matrix 50 may provide advantages when used as a haptic feedback actuator. For example, some arrangements may be quite robust and may operate sufficiently within a handheld device subject to various forces or stresses, such as the force of being dropped on a hard surface. Also, some arrangements allow the structure to be flexible, allowing the structure to be applied to practically any shaped surface. Some arrangements can be very thin, even to a thickness similar to the form factor of adhesive tape. Therefore, it can be operative even with a very small size.

In embodiments where the composite piezoelectric structure is formed as haptic tape, it can also be used as a sealant. Haptic tape is also scalable to any desired dimensions. Also, it can be secured using any suitable adhesive, which can be easier than other securing components such as screws. Furthermore, composite piezoelectric structure 46 can be operated efficiently while consuming a small amount of power.

Composite piezoelectric structure 46 can be integrated as an actuator between a display, such as an LCD, and a touch sensitive layer of an electronic device. When voltage is applied to their ends, piezoelectric rods 48 deform along their longitudinal axis, thereby moving the touch sensitive layer in a direction normal to its plane or tangent. Thus, rods 48 deform up and down to cause vibration of the whole polymer matrix 50. Various haptic effects in a direction perpendicular to a plane or tangent of the surface of composite piezoelectric structure 46 can be provided in this way by stimulating composite piezoelectric structure 46 with different input voltage profiles. In some embodiments, composite piezoelectric structure 46 can be configured such that the direction of deformation of rods 48 is lateral to thus create a lateral motion of the touch surface.

Moreover, the viscoelastic characteristics of the polymer matrix 50 can be tuned in a way that the structure can serve as a suspension mechanism with a desired natural dampening frequency. The viscoelastic characteristics may also serve to isolate any vibration that is transferred to the touch sensitive layer from the rest of the electronic device, resulting in well-controlled haptic effects. Polymer matrix 50 may be specifically designed to provide certain stiffness properties, dampening properties, suspension properties, softness properties, vibration properties, or other haptic related properties.

The embodiments described herein represent a number of possible implementations and examples and are not intended to necessarily limit the present disclosure to any specific embodiments. Instead, various modifications can be made to these embodiments as would be understood by one of ordinary skill in the art. Any such modifications are intended to be included within the spirit and scope of the present disclosure and protected by the following claims.

What is claimed is:

1. An input/output device comprising:
   a touch sensitive layer configured to sense if an object touches the touch sensitive layer and to sense where the touch sensitive layer is contacted;
   a display layer configured to display images;
   a first electrode layer and a second electrode layer, at least a portion of one of the first electrode layer and the second electrode layer connected to at least a portion of the touch sensitive layer;
   a haptic tape comprising a composite piezoelectric layer connected between the first electrode layer and the second electrode layer, the composite piezoelectric layer having a plurality of piezoelectric rods arranged in a polymer matrix, the haptic tape being attached to the touch sensitive layer and the display layer to provide a seal between the touch sensitive layer and the display layer; and
   a drive circuit configured to apply an alternating voltage to the first electrode layer and the second electrode layer in response to the sensed object to generate a haptic effect.

2. The input/output device according to claim 1, wherein the display layer comprises a virtual reality display device.

3. The input/output device according to claim 1, wherein the piezoelectric rods span across the width of the composite piezoelectric layer such that each piezoelectric rod is in contact with the first electrode layer and the second electrode layer.

4. The input/output device according to claim 1, wherein when the piezoelectric rods are stimulated by the alternating voltage, the piezoelectric rods expand and contract in a longitudinal direction.

5. The input/output device according to claim 4, wherein the expanding and contracting of the piezoelectric rods causes the touch sensitive layer to move in a direction perpendicular to a surface or tangent of the display layer.

6. The input/output device according to claim 4, wherein the expanding and contracting of the piezoelectric rods causes vibration of the polymer matrix in which the piezoelectric rods are arranged.

7. An input/output device comprising:
   a touch sensitive layer configured to sense if an object touches the touch sensitive layer and to sense where the touch sensitive layer is contacted;
   a first electrode layer and second electrode layer, at least a portion of one of the first electrode layer and second electrode layer connected to at least a portion of the touch sensitive layer;
   a composite piezoelectric layer connected between the first electrode layer and second electrode layer, the composite piezoelectric layer having a plurality of piezoelectric rods arranged in a polymer matrix, the polymer matrix configured to be tuned to provide the composite piezoelectric layer with a predetermined property;
   a drive circuit configured to apply an alternating voltage to the first electrode layer and second electrode layer in response to the sensed object.

8. The input/output device according to claim 7, wherein the predetermined property is a haptic related property selected from the group consisting of: stiffness, dampening, suspension, softness, and vibration.

9. The input/output device according to claim 7, further comprising a display layer configured to visually display images.

10. The input/output device according to claim 7, further comprising a virtual reality display device.

11. The input/output device according to claim 7, wherein the piezoelectric rods span across the width of the composite piezoelectric layer such that each piezoelectric rod is in contact with the first electrode layer and the second electrode layer.

12. The input/output device according to claim 7, wherein when the piezoelectric rods are stimulated by the alternating voltage, the piezoelectric rods expand and contract in a longitudinal direction.

13. The input/output device according to claim 12, wherein the expanding and contracting of the piezoelectric rods causes the touch sensitive layer to move in a direction perpendicular to a surface or tangent of the display layer.

14. The input/output device according to claim 12, wherein the expanding and contracting of the piezoelectric rods causes vibration of the polymer matrix in which the piezoelectric rods are arranged.

* * * * *